US010084477B2

(12) United States Patent
Heusser

(10) Patent No.: US 10,084,477 B2
(45) Date of Patent: Sep. 25, 2018

(54) METHOD AND APPARATUS FOR ADAPTIVE DATA COMPRESSION

(71) Applicant: PARSTREAM GMBH, Cologne (DE)

(72) Inventor: Norbert Heusser, Bonn (DE)

(73) Assignee: PARSTREAM GMBH (DE)

( * ) Notice: Subject to any disclaimer, the term of this patent is extended or adjusted under 35 U.S.C. 154(b) by 0 days.

(21) Appl. No.: 15/551,377

(22) PCT Filed: Feb. 17, 2016

(86) PCT No.: PCT/EP2016/025015
§ 371 (c)(1),
(2) Date: Aug. 16, 2017

(87) PCT Pub. No.: WO2016/131554
PCT Pub. Date: Aug. 25, 2016

(65) Prior Publication Data
US 2018/0041223 A1 Feb. 8, 2018

(30) Foreign Application Priority Data

Feb. 17, 2015 (DE) .................. 10 2015 002 138

(51) Int. Cl.
H03M 7/00 (2006.01)
H03M 7/40 (2006.01)
(Continued)

(52) U.S. Cl.
CPC ........ H03M 7/40 (2013.01); G06F 17/30312 (2013.01); H03M 7/3064 (2013.01); H03M 7/46 (2013.01)

(58) Field of Classification Search
CPC ........ H03M 7/40; H03M 7/46; H03M 7/3064; G06F 17/30312
(Continued)

(56) References Cited

U.S. PATENT DOCUMENTS 5,319,682 A 6/1994 Clark
5,376,968 A 12/1994 Wu et al.
(Continued)

FOREIGN PATENT DOCUMENTS

WO WO2010050924 5/2010

OTHER PUBLICATIONS

Jin et al., "Adaptive Data Compression for High-Performance Low-Power On-Chip Networks", dated Nov. 8, 2008, 10 pages.
(Continued)

Primary Examiner — Peguy Jean Pierre
(74) Attorney, Agent, or Firm — Hickman Palermo Becker Bingham LLP

(57) ABSTRACT

Adaptively compressing an input string (10) comprising a sequence of symbols in order to create a plurality of segment dictionaries $D_m$, with the steps of: generating a lookup map (110); generating a key value segment $S_{m,n}$; searching the lookup map for each symbol received in the input string (120, 130); upon detecting a symbol is not stored in the lookup map, adding the symbol by storing the symbol at a next sequential key index in the lookup map lookup map (135) and assigning a next sequential key value entry to the symbol and adding this key value to the key value segment $S_{m,n}$ (150); upon detecting the symbol is stored in the lookup map, adding the corresponding key value assigned to this symbol to the next sequential entry of the key value segment $S_{m,n}$ (150); wherein a new key value segment $S_{m,n+1}$ of the lookup map is generated if the number of different symbols equals the number of available key values $k=2^n$ for the opened/current key value segment $S_{m,n}$ (141, 142), and where-in the lookup map is converted into a segment dictionary $D_m$ if the maximal key value size $k_{nmax}=2^{nmax}$ is reached (132, 133, 134), with n being any positive integral number 1 to nmax, nmax denoting the maximal bit size, and (Continued)

m being any positive integral number denoting the consecutive numbering of segment dictionaries $D_m$.

14 Claims, 7 Drawing Sheets

(51) Int. Cl.
    *G06F 17/30*     (2006.01)
    *H03M 7/30*     (2006.01)
    *H03M 7/46*     (2006.01)

(58) Field of Classification Search
    USPC ................................ 341/50, 51, 106, 67, 65
    See application file for complete search history.

(56) References Cited

U.S. PATENT DOCUMENTS

| | | |
|---|---|---|
| 5,452,104 A | 9/1995 | Lee |
| 5,475,502 A | 12/1995 | Lee et al. |
| 5,682,152 A | 10/1997 | Wang et al. |
| 6,192,157 B1 | 2/2001 | Prebble |
| 6,606,040 B2 | 8/2003 | Abdat |
| 7,167,115 B1 * | 1/2007 | Mondal ............... H03M 7/3088 341/51 |
| 7,180,909 B1 * | 2/2007 | Achler ................ H03M 7/3084 370/466 |
| 2007/0096954 A1 | 5/2007 | Boldt et al. |
| 2013/0318093 A1 | 11/2013 | Conron et al. |
| 2014/0085115 A1 | 3/2014 | Beier et al. |

OTHER PUBLICATIONS

Bentley et al. "A Locally Adaptive Data Compression Scheme", Programming Techniques and Data Structures, Communications of the ACM, vol. 29, No. 4, dated Apr. 1986, 11 pages.

Anderson K, "Overview of Huffman Encoding As Compression Technique", Computer Technology Review, Westworld Production, Beverly Hill, CA, US, (May 1, 1991), vol. 11, No. 6, ISSN 0278-9647, pp. 97-98.

Salomon D Ed—Salomon David, Data Compression: The Complete Reference, Statistical Methods, Data Compression : The Complete Reference, Springer, New York, pp. 21-24, ISBN 978-0-387-98280-9.

Anderson K, "Overview of Huffman Encoding As Compression Technique", Computer Technology Review, Westworld Production, Beverly Hill, CA, US, vol. 11, No. 6, May 1, 1991 (May 1, 1991) ISSN 0278-9647 pp. 97-98, 100, XP000230832, ISSN:0278-9647.

Salomon D Ed—Salomon David:, "Data Compression: The Complete Reference Statistical Methods", Jan. 1, 1998 (Jan. 1, 1998) Data Compression : The Complete Reference Springer, New York, pp. 21-24, XP002296642, ISBN 978-0-387-98280-9.

* cited by examiner

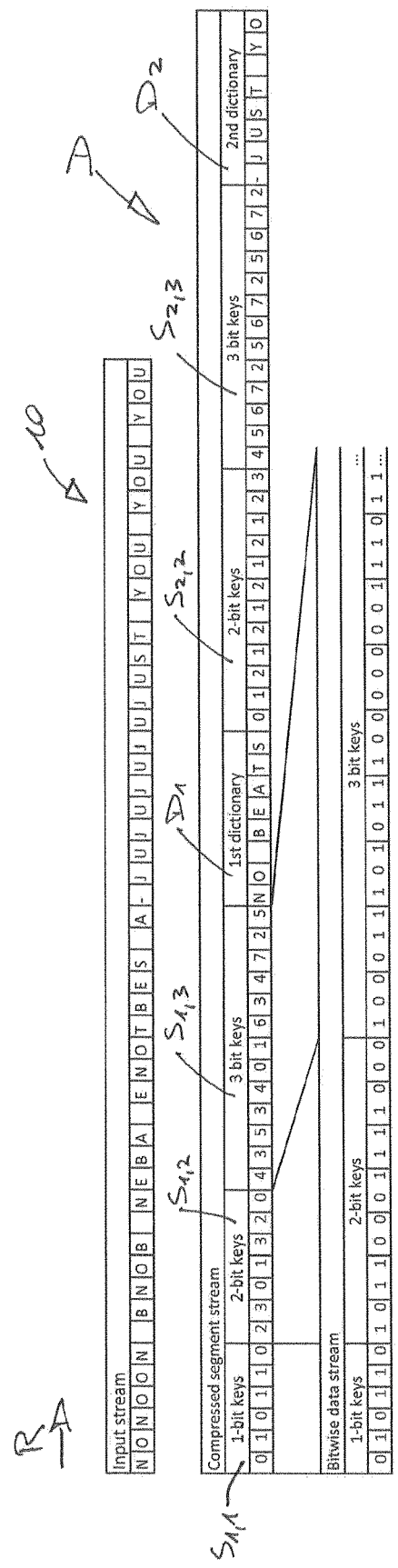

Fig. 6

METHOD AND APPARATUS FOR ADAPTIVE DATA COMPRESSION

This application is a US national stage application filed under 35 U.S.C. § 371 based upon International Patent Application PCT/EP2016/025015, filed 17 Feb. 2016, which claims the benefit of German Application 102015002138.9, filed 17 Feb. 2015, the entire contents of which are hereby incorporated by reference as if fully set forth herein for all purposes.

TECHNICAL FIELD

The present invention relates to a computer method and an apparatus for adaptive data compression, and particularly to a computer method and apparatus for adaptive data compression in the field of dictionary encoding.

Dictionary encoding is a commonly used process in compression of structured data. Compression of data refers to process of reducing the amount of data needed to represent a given information. To this end, redundant or unnecessary data is removed from the total of the structured data. Data compression techniques reduce the costs for information storage and transmission. They are used in many applications, ranging from simple file size reduction to speech and video encoding.

The two different types of data compression are lossless compression and lossy compression. In lossless compression, the source message or string at the encoder input is retrieved exactly at the output of the decoder. In lossy compression, the string is not retrieved exactly but the information loss is tolerable for the type of application targeted by the compression schemes. Lossy compression is mainly used for speech, audio, image and video signals. The aim of the compression algorithm is to represent a signal with a minimum number of bits while maintaining the signal intelligibility and perceptual quality. All the information that cannot be perceived by human sensors can be removed. Lossless compression techniques are used in applications where no information losses are tolerable such as compressing executable and source code files, databases, satellite imaging and medical imaging. The techniques are also used as part of lossy compression schemes for better compression ratios.

Dictionary encoding is the process of replacing each instance of a data item with a short code word and using a dictionary data structure to convert code words back into values, thus reducing the size of these data items. The use of dictionary encoding is particularly advantageous for data items with repeated values such as prizes, names, and machine operation protocols.

US 2014/0085115 A1 discloses a data compression using dictionary encoding, including subdividing a table of uncompressed data into a first block and a second block of complete rows, determining information about a frequency of occurrence of different values for each column of the first block, selecting a row of the first block to be removed out of the first block using frequency of occurrence-information, removing the row out of the first block to form an updated first block and determining information about a frequency of occurrence of different values for each column of the updated first block, deriving a dictionary containing code words for encoding the values of the updated first block, encoding the values of the updated first block based on the code words, and adding the removed row to the second block.

U.S. Pat. No. 6,606,040 B2 discloses an adaptive data compression in which an alphabet and vocabulary in the encoder and decoder is built adaptively and stored in a dictionary as symbols are to be encoded and decoded. Each time an unknown symbol is to be encoded by the encoder, the encoder adds the symbol to the dictionary and transmits it in plain in the encoded string. The code words transmitted by the encoder include symbols and indexes. The state of a prefix bit preceding the code word indicates whether the code word is a plain symbol or an index of a symbol or string of symbols stored in the dictionary. The decoder examines prefix bit of each code word as it is received to determine if the code word stores a symbol in plain or in index. If the code word stores a symbol in plain, the decoder learns the symbol by adding a sequence of symbols resulting from the concatenation of previously decoded symbols and the first symbol of the currently decoded symbol and by adding the symbol to its dictionary. If the code word stores an index, the decoder decodes the code word by extracting the symbol or sequence of symbols stored in the dictionary at the respective index in the dictionary.

The main problem in using dictionary compression is the need to know upfront the number of different values in the column to be processed. This is particularly crucial for streamed data processing as it is not possible to analyze the data upfront.

SUMMARY

In contrast thereto, the invention provides a computer program method and an apparatus for adaptively compressing an input string comprising a sequence of symbols with the features of claims 1 and 4, respectively. The invention further provides a computer program with the features of claim 7 as well as a digital database with the features of claim 10.

According to the invention, an adaptive key size storage is combined with multiple dictionaries, or in other words, the encoder dictionary is made up of a plurality of segment dictionaries with a predetermined limited (but variable) maximal key value size. The approach according to the invention results in a good compression but without the need of analyzing incoming string data upfront. The only parameter for tuning the compression is to specify (minimal and) maximal size of the key values to be used.

An incoming or input string is sequentially analyzed for the symbols it is containing, and a lookup map is searched for each symbol received in the input string. If a symbol is not stored in the lookup map yet, the symbol is added by storing the symbol at a next sequential index in the lookup map. A next sequential key value entry is assigned to the symbol, with this key value being added to a key value segment. If the symbol is already stored in the lookup map, the corresponding key value assigned to this symbol is added to the next sequential entry of the key value segment. Once the number of different symbols equals the number of available key values for the opened/current key value segment, a new key value segment is generated and the lookup map is converted into a segment dictionary, if the maximal key value size is reached.

Thus, the method of the invention results in an encoder dictionary built up by a plurality of segment dictionaries, with limited decoder key size.

For example, given that m and n are natural numbers (integral values) with m being any positive integral number denoting the consecutive numbering of segment dictionaries $D_m$ and n being any positive integral number 1 to nmax, nmax denoting the maximal bit size, and the maximal key values size is defined as $k_{nmax}=2^{nmax}$, a segment dictionary $D_m$ may contain up to $2^{nmax}$ different values/symbols. The symbols in a given segment dictionary $D_m$ are identified by using a key value $k_n$. Symbol identification is therefore realized by assigning the values 0 to $2^n-1$. Thus, n bits are needed to store a value $k_n$.

The invention also covers a computer program with program coding means which are suitable for carrying out a message according to the invention as described above when the computer program is run on a computer. The computer program it self as well as stored on a computer-readable medium is claimed.

Further features and embodiments of the invention will become apparent from the description and the accompanying drawings.

It will be understood that the features mentioned above and those described hereinafter can be used not only in the combination specified but also in other combinations or on their own, without departing on this scope of the present invention.

The invention is schematically illustrated in the drawings by means of an embodiment by way of example and is hereinafter explained in detail with reference to the drawings. It is understood that the description is in now way limiting on the scope of the present invention and is merely an illustration of a preferred embodiment of the invention.

BRIEF DESCRIPTION OF THE DRAWINGS

FIG. 1a shows a schematic block diagram depiction illustrating an example of an adaptive dictionary setup of the invention.

FIG. 6 is a more detailed illustration of the depiction of FIG. 5 showing the content of the compressed dictionary database setup.

DETAILED DESCRIPTION

FIG. 1a shows a schematic depiction illustrating the invention. Particularly, FIG. 1a shows an incoming string 10 and its adaptive compression (compressed segment stream D) according to the invention comprising a plurality of segment dictionaries $D_1$, $D_2$. The dictionaries are accompanied by key value segments $S_{1,1}$, $S_{1,2}$, $S_{1,3}$, $S_{2,2}$, $S_{2,3}$. The key value segments $S_{m,n}$ are sorted according to the n-bit keys. The key value segments $S_{m,n}$ are stored in front of the respective segment dictionaries $D_m$. Below the compressed segment stream D, the bitwise data stream of the key value segments is illustrated, i.e. the actual bit entries are shown.

In the embodiment shown in FIG. 1a, the maximal key value size is set to be $k_{nmax}=8$, resulting in a bit size of nmax=3 as $k_{nmax}=2^n$. Each segment dictionary $D_m$ of the embodiment according to the invention can thus contain up to a maximum of eight character entries.

Figure 2:
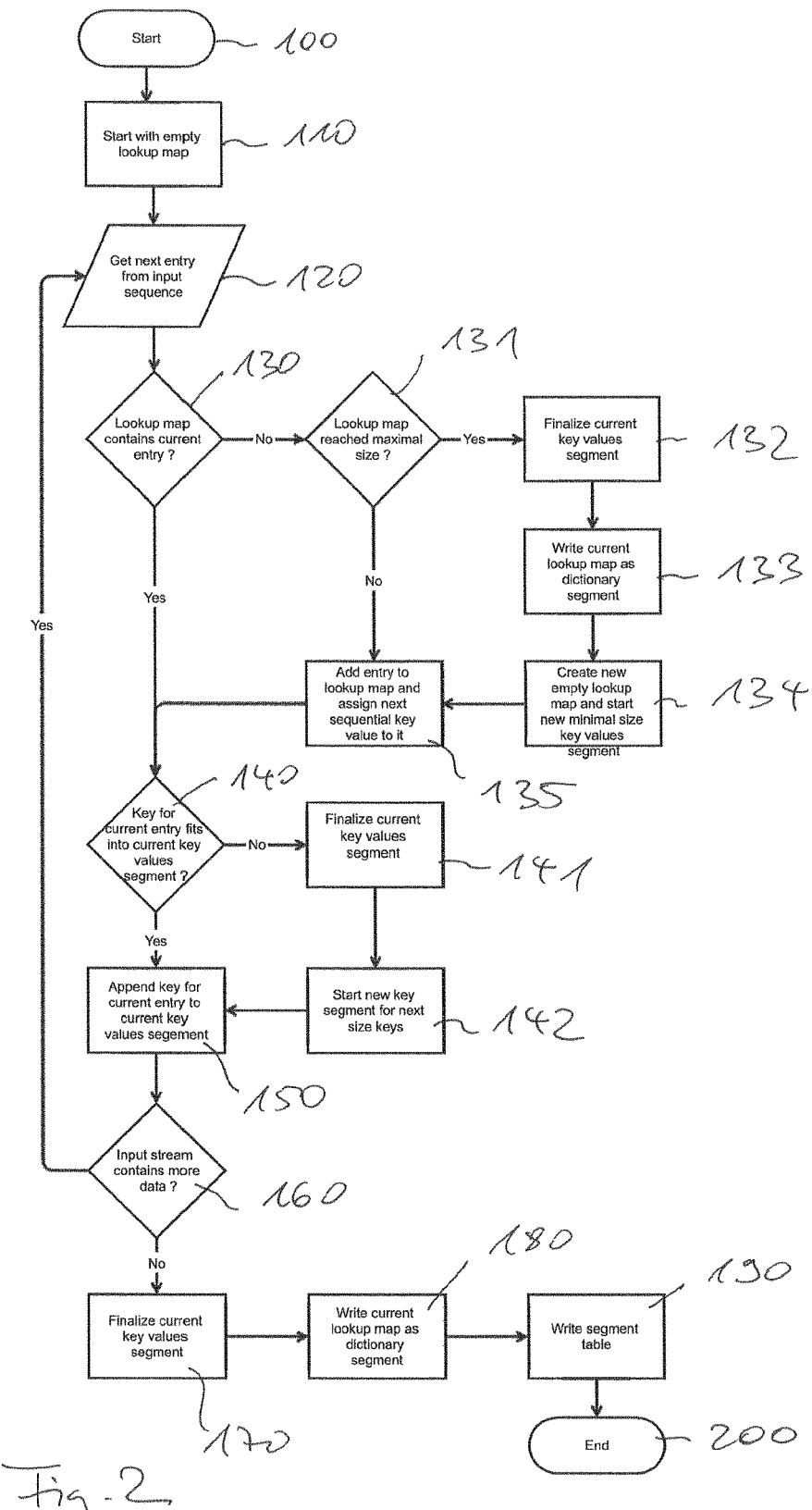
FIG. 2 is a flow diagram illustrating the method of the invention.
Figure 3:
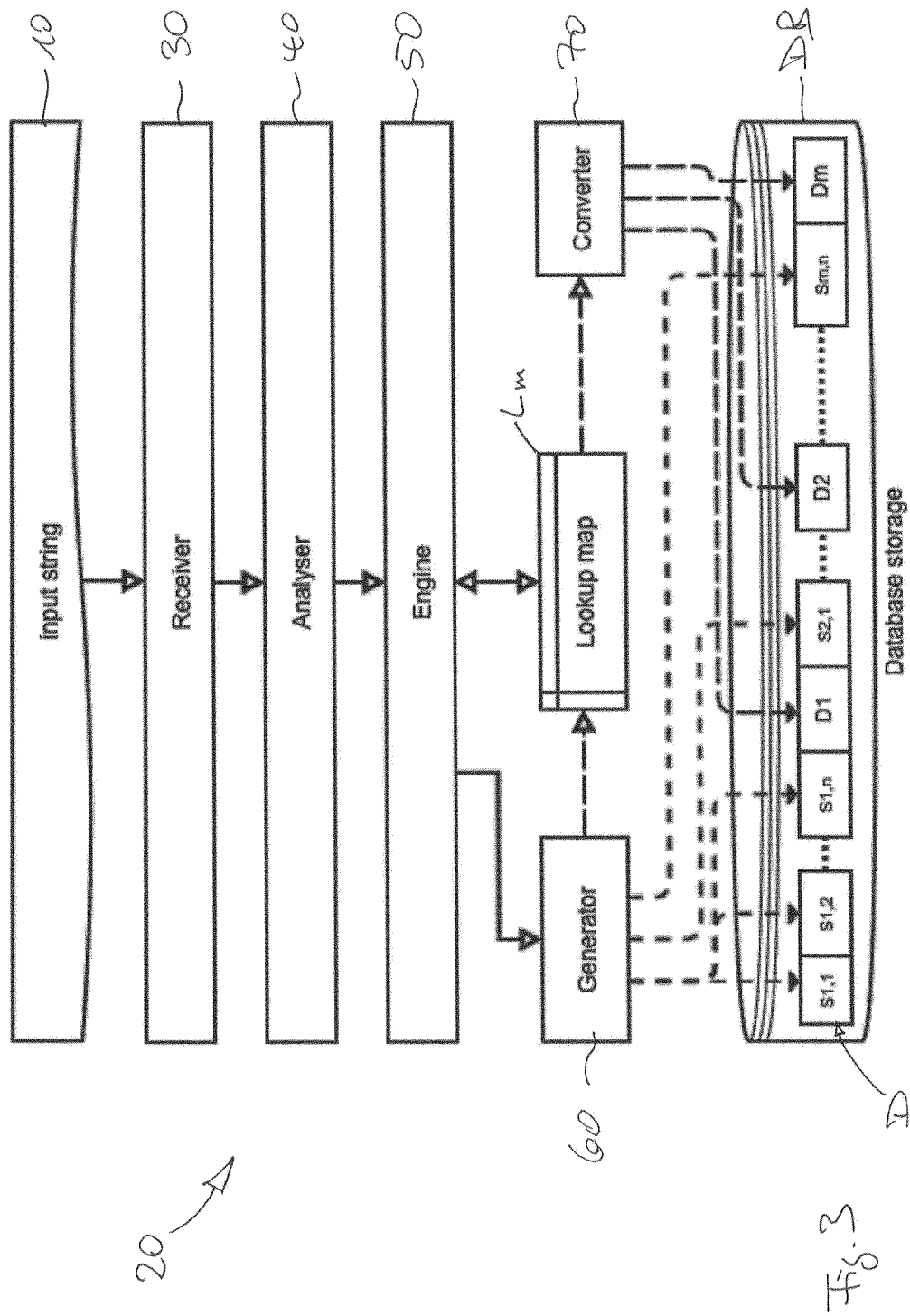
FIG. 3 shows a schematic block diagram illustrating an apparatus of the invention.

FIG. 2 shows the flow diagram of the method of the invention, and FIG. 3 illustrates an exemplary embodiment of an apparatus 20 to perform the method of the invention. The apparatus 20 can be a computer database system, and the exemplary embodiment comprises a database storage DB for storing a plurality of segment dictionaries $D_m$, a receiver 30 for receiving an input string 10, an analyzer 40 for excerpting each symbol from the sequence of symbols of the input string 10, a generator 60 for generating a lookup map $L_m$ and a key value segment $S_{m,n}$, an engine 50 for detecting whether a symbol is contained in a lookup map $L_m$, and a converter 70 to convert a lookup map $L_m$ into a segment dictionary $D_m$.

Figure 1B:
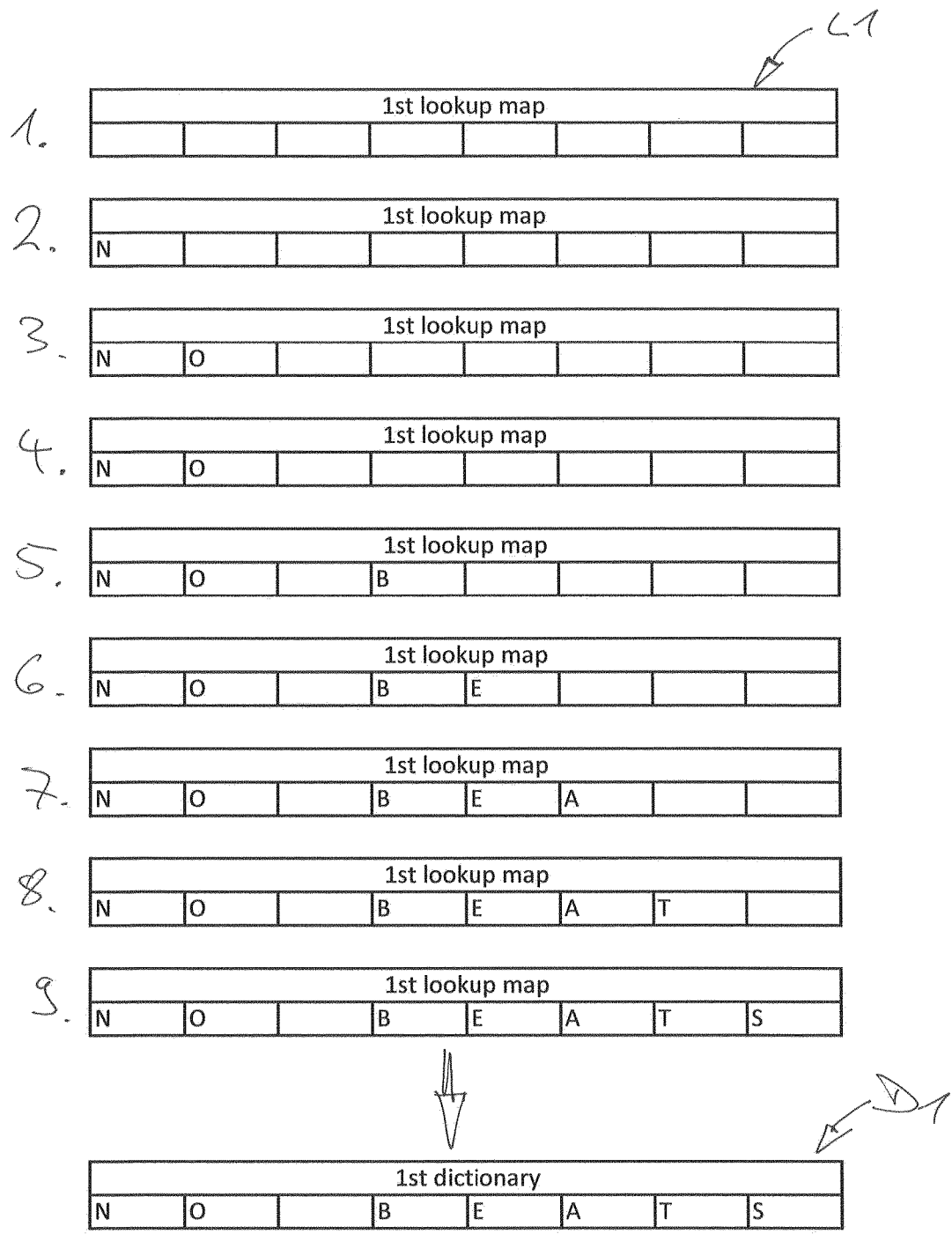
FIG. 1b shows the first lookup map of the example of FIG. 1a in subsequent filling states until creation of the first segment dictionary.

With reference to FIG. 1a, an incoming character string 10 consists of a plurality of various characters. The incoming or input string 10 is read from the left to right as indicated in FIG. 1a by arrow R. When starting (step 100 in FIG. 2) the method to adaptively compress an input string 10 received by the receiver 30, a new lookup map $L_1$ ($L_m$ with m=1) with $k_{nmax}=2^3=8$ empty array cells (key indices) is generated (cf. step 110 in FIG. 2) by generator 60, and there will first be no entry in the lookup map $L_1$ (cf. FIG. 1b, top, sequence 1).

Therefore, the first character taken from the input string 10 by the analyzer 40 (cf. step 120), namely "N" is not to be found in the lookup map $L_1$ by the engine and is therefore entered in the lookup map $L_1$ at the first key index (cf. sequence 2 in FIG. 1b, and steps 130, 131, 135 of FIG. 2), and an according key value "0" is entered in a first key value segment $S_{1,1}$ containing the one-bit keys (cf. first entry in key value $S_{1,1}$ segment in the depiction of FIG. 1a and steps 140, 150 of FIG. 2).

Then the second character is taken from input string 10 (cf. steps 160, 120 of FIG. 2), namely "O", which is also not contained in the first lookup map $L_1$ yet and therefore entered in the next sequential key index of the first lookup map $L_1$ (cf. sequence 3 in FIG. 1b and repetition of steps 130, 131, 135 of FIG. 2) with an according key value "1" entered into first key value segment "$S_{1,1}$" at the next position (cf. second entry in key value $S_{1,1}$ segment in the depiction of FIG. 1a and repetition of steps 140, 150 of FIG. 2).

Then, the third character, namely "N", is read (steps 160, 120 of FIG. 2). As this character is already contained in the lookup map, namely in the first key index of the first lookup map $L_1$, there is no additional entry of this character into the lookup map $L_1$. However, the corresponding key value "0" is entered in the next sequential entry of the first key value segment $S_{1,1}$ (cf. FIG. 2: step 130 directly refers to steps 140 and 150).

This is repeated for the next three characters "OON" already contained in the lookup map $L_1$ and resulting in the bit key entries "110" in the first key value segment $S_{1,1}$ as depicted in FIG. 1a.

Then a new character, namely a blank " ", is identified in input string 10, resulting in a new entry in the first lookup map $L_1$ (cf. sequence 4 of FIG. 1b). As this is the third character in the lookup map $L_1$, the one-bit key segment $S_{1,1}$ is not available anymore, and the next, i.e. second key value segment for two-bit keys $S_{1,2}$ is started, bearing entry "2" for the character " " (blank) (cf. steps 140, 141, 142, 150 of FIG. 2).

Step 160 then refers back to step 120, and the following character "B" is also new to the lookup map $L_1$ such that this character is entered into the fourth key index of first lookup map $L_1$ (sequence 5 of FIG. 1b) and a corresponding key value "3" is added to the second key value segment $S_{1,2}$. The next five characters "NOB N" are already contained in the lookup map so that no new entries are done to the first lookup map $L_1$, but of course resulting in the new key value assignments "01320" to the second key value segment $S_{2,1}$.

The following character "E" in input string 10 (which is the fourteenth character in the string) is another character which is not yet contained in the lookup map. As this the fifth new character, it is entered in the fifth key index of the first lookup map $L_1$ (cf. sequence 6 of FIG. 1b), and as the two-bit key value segment $S_{1,2}$ is now full (containing $2^n$ with n=2 values), the third key value segment $S_{1,3}$ is started with the entry "4" assigned to the new character "E" (cf. FIG. 1a).

This third key value segment $S_{1,3}$ is the last key value segment as it provides entry of up to eight different symbols ($k_{nmax}=2^3$). This eighth character in the example input string 10 is the character "S" (which is the $24^{th}$ character in this string), and it is assigned key value "7" and is the last entry in the first lookup map $L_1$ (cf. sequences 7 to 9 in FIG. 1b).

As the following two characters on positions 25 and 26 are already contained in the dictionary (" " and "A"), there are two more entries into the third key value segment $S_{1,3}$ so that the last three entries of this segment read "725".

The next position in input string 10 (position number 27) contains the ninth different character, namely a "-". As the maximum of eight key values is reached, the current key value segment $S_{1,3}$ is finalized and the first lookup map $L_1$ is converted into first segment dictionary $D_1$ by the converter 70 (cf. bottom of FIG. 1b after sequence 9, and steps 131, 132, 133 of FIG. 2). Then, a new (second) lookup map $L_2$ is opened, with an according key value segment (step 134). The new character "-" is entered into the first entry position or key index of the second lookup map $L_2$ and an according entry is added to the segment key $S_{2,2}$.

It is to be noted that in the creation of the second lookup map $L_2$ in the embodiment shown in FIG. 1, no 1-bit key segment is created but directly the 2-bit key segment $S_{2,2}$ is opened as the first three characters starting at position 27 "-JU" are three distinct different characters so that the 1-bit key segment would only consist of the two entries "01". It is of course understood that there could as well be a 1-bit segment $S_{2,1}$.

As shown in the depiction of FIGS. 1a and 3 the key segments may be stored in front of the respective corresponding segment dictionary.

Figure 4:
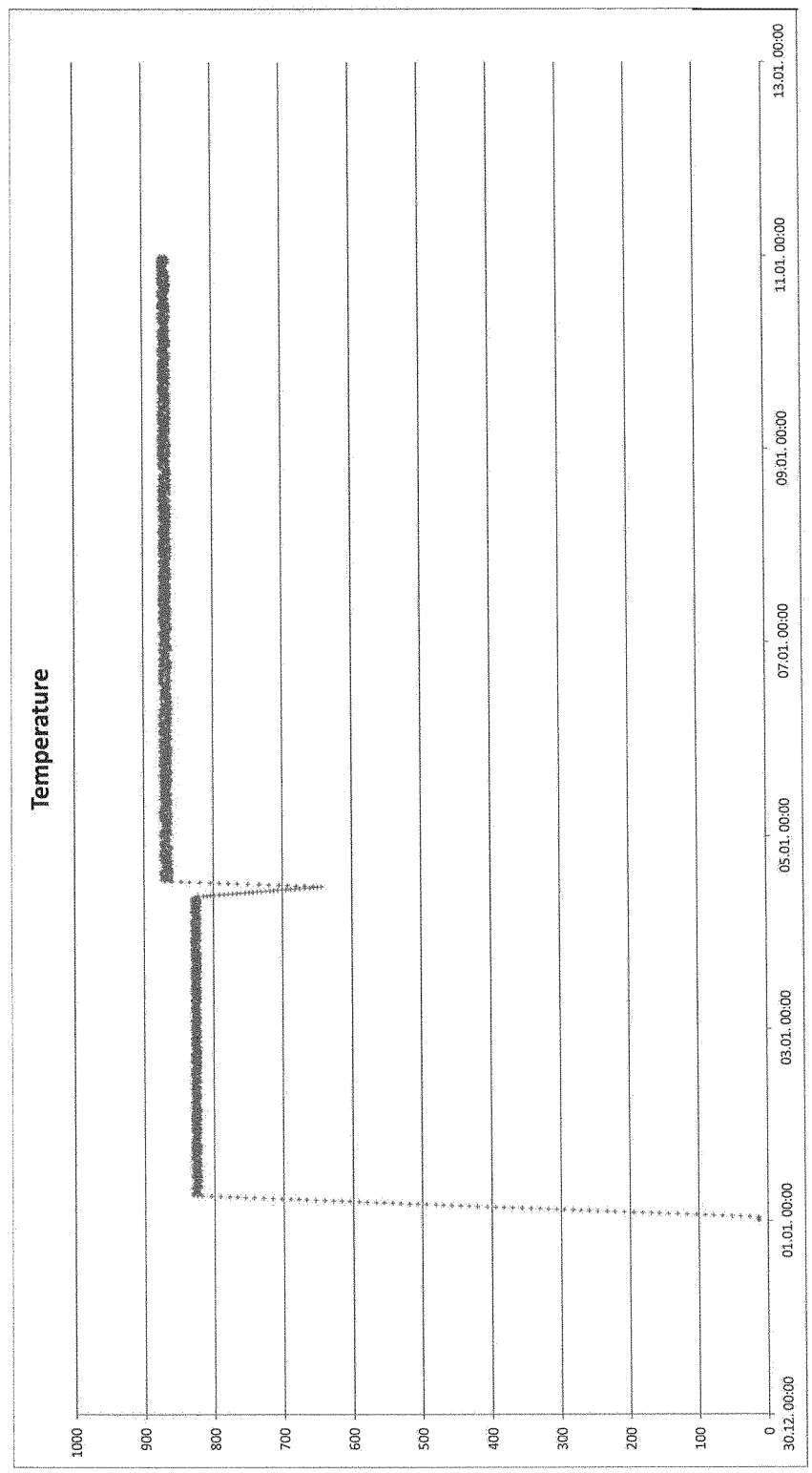
FIG. 4 is a graph showing a temperature profile of a turbine in operation.
Figure 5:
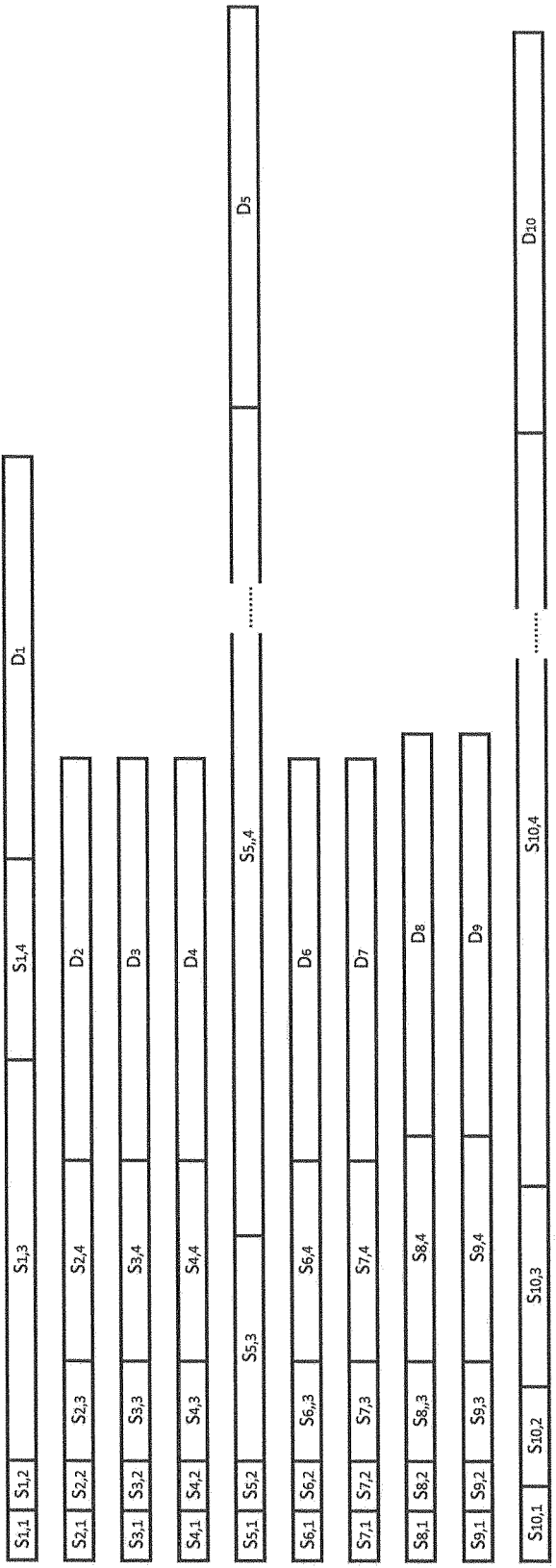
FIG. 5 is a schematic depiction of the compressed dictionary database setup of the temperature data of FIG. 4 according to the invention.

FIG. 4 shows a graph with a temperature profile of a turbine in operation, and FIG. 5 is a schematic depiction of the plurality of segment dictionaries obtained from the temperature data of the graph of FIG. 4.

The graph of FIG. 4 shows a turbine that is put into operation on $1^{st}$ January. In the beginning, the operating temperature of the turbine is at around room temperature, and then increases at a rate of roughly 100 to 120° C. per hour until it reaches a first operating temperature at around 825±5° C. This level is maintained during a long term operation until $4^{th}$ January when a reconfiguration mode is run which brings the temperature down to around 640° C. within around two hours and then directly back up to second operation level at around 870±8° C. within another two hours. The turbine is then operated at this second temperature level for several days.

By using the method of the invention for adaptively compressing the input string comprising the sequence of temperature measurement values, a relatively small dictionary size is chosen, unlike known methods which would work with a dictionary size covering the whole span of around 14° C. to 1,000° C.

As can be seen from the depiction of FIG. 5, nmax is chosen to be 4, leading to a maximum key value size of $k_{nmax}=2^4=16$, and an according maximum segment dictionary size of 16 entries.

This approach leads to a compressed segment stream as illustrated in FIG. 5 with a plurality of segment dictionaries $D_1$ to $D_{10}$, each having associated four key value segments $S_{1,1}$, $S_{1,2}$, $S_{1,3}$, $S_{1,4}$; $S_{2,1}$, $S_{2,2}$, $S_{2,3}$, $S_{2,4}$; . . . ; $S_{10,1}$, $S_{10,2}$, $S_{10,3}$, $S_{10,4}$.

In the heating-up phase (first four lines in FIG. 5, corresponding to segment dictionaries $D_1$ to $D_4$) and the reconfiguration phase (lines six to nine in FIG. 5, corresponding to segment dictionaries $D_6$ to $D_9$), the key value segments are rather short and there is a higher number of segment dictionaries as the temperature measurement readings vary fast in these phases, i.e. there are a lot of different values.

In contrast thereto, the two stable operating phases at around 825° C. and 870° C., respectively, each only have one segment dictionary with accordingly longer key value segments (i.e. key value segments with more entries) as the incoming temperature measurement readings are repeatedly the same values within a small interval (cf. lines five and ten of FIG. 5, corresponding to segment dictionaries $D_5$ to $D_{10}$).

Figure 6:
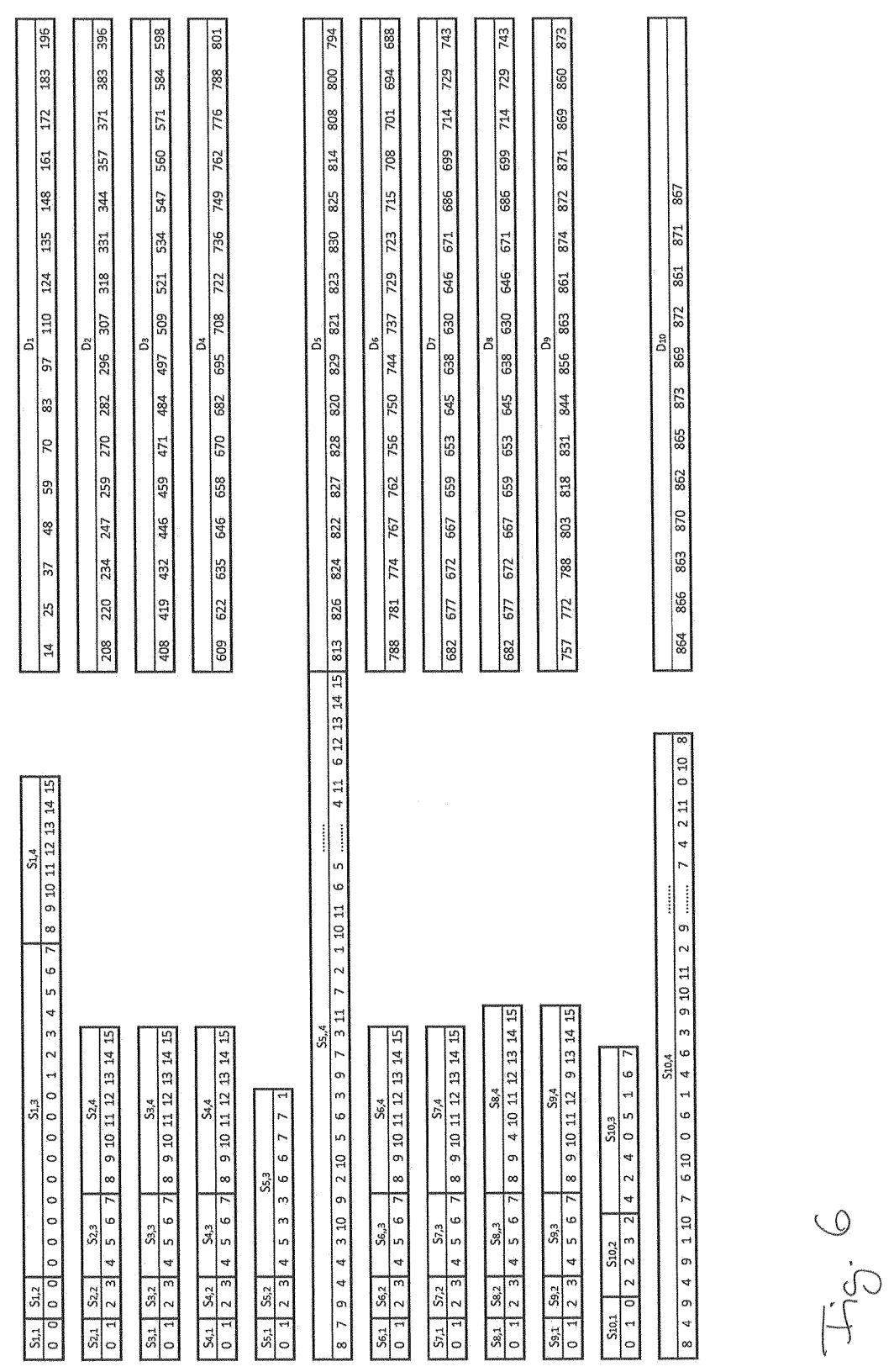

FIG. 6 shows the depiction of FIG. 5 in more detail, particularly by showing the actual entries in the key value segments and the segment dictionaries. The entries in segment dictionaries $D_1$ to $D_4$ and $D_6$ to $D_9$ reflect the rapid temperature changes in the high gradient portions of the temperature profile of FIG. 4, the first temperature increase starting at 14° C. in $D_1$ to 801° C. in $D_4$, whereas the entries in segment dictionaries $D_5$ to $D_{10}$ reflect the stable plateau phases of the temperature profile of FIG. 4 with temperatures of around 825° C. in segment dictionary $D_5$ and 870° C. in segment dictionary $D_{10}$ (at the end of segment dictionary $D_5$ the decrease phase already starts as reflected by the last three to four entries).

According to the teachings of the invention, the key value segments are filled quite fast with the sixteen available values such that the key value segments of dictionaries $D_1$ to $D_4$ and $D_6$ to $D_9$ remain relatively short. In the stable phases, the temperatures are more repetitive such that are also repetitive and accordingly longer (cf. particularly key value segments $S_{5,4}$ and $S_{10,4}$).

As a reading example, the first temperature entry of segment dictionary $D_1$ equaling 14° C. corresponds to the first 13 measurement values (all four entries of key value segments $S_{1,1}$ and $S_{1,2}$ and the first nine entries of key value segments $S_{1,3}$). The sequence of the measurement values stored in segment dictionary $D_{10}$ and key value segments $S_{10,1}$ and $S_{10,2}$ is 864° C., 866° C., 864° C., 863° C., 863° C., 870° C., 863° C., etc.

The example of FIGS. 4 to 6 shows how the invention can create a database compression which adapts to the nature of the data to be compressed, i.e. having a higher number of segment dictionaries with short key value segments in cases of highly varying data, and having a very low number of segment dictionaries with accordingly longer key value segments in case of stable or less varying data, all of the segment dictionaries having the same maximum size.

The invention claimed is:

1. A computer method for adaptively compressing an input string (10) comprising a sequence of symbols in order to create a plurality of segment dictionaries Dm, the method comprising the steps of:
generating a lookup map (110);
generating a key value segment Sm,n;
searching the lookup map for each symbol received in the input string (120, 130);
upon detecting a symbol is not stored in the lookup map, adding the symbol by storing the symbol at a next sequential key index in the lookup map (135) and assigning a next sequential key value entry to the symbol and adding this key value to the key value segment Sm,n (150);

upon detecting the symbol is stored in the lookup map, adding the corresponding key value assigned to this symbol to the next sequential entry of the key value segment Sm,n (150);

wherein a new key value segment Sm,n+i of the lookup map is generated if the number of different symbols equals the number of available key values $k=2^n$ for the opened/current key value segment Sm,n (141, 142), and wherein the lookup map is converted into a segment dictionary Dm if the maximal key value size $knmax=2^{nmax}$ is reached (132, 133, 134), with n being any positive integral number 1 to nmax, nmax denoting the maximal bit size, and m being any positive integral number denoting the consecutive numbering of segment dictionaries Dm.

2. The method of claim 1, wherein the plurality of segment dictionaries Dm with the corresponding key value segments Sm,n form a column store database.

3. The method of claim 1, wherein the maximal key value size kn,max is predeterminable.

4. The method of claim 3, wherein the maximal key value size kn,max is predeterminable.

5. An apparatus (20) for adaptively compressing an input string (10) having a sequence of symbols, the apparatus (20) comprising a database storage (DB) for storing a plurality of segment dictionaries (Dm), a receiver (30) for receiving an input string (10), an analyzer (40) for excerpting each symbol from the sequence of symbols of the input string (10), a generator (60) for generating a lookup map (Lm) and a key value segment (Sm,n), an engine (50) for detecting whether a symbol is contained in a lookup map (Lm), and a converter (70) to convert a lookup map (Lm) into a segment dictionary (Dm), wherein the generator (60) generates a lookup map (Lm) and a key value segment (Sm,n) once the receiver (30) receives an input string (10), and the engine (50) searches the lookup map (Lm) for each symbol received in the input string (10) excerpted by the analyzer (40), wherein upon detecting a symbol is not stored in the lookup map (Lm), the symbol is added to the lookup map (Lm) by storing the symbol at a next sequential key index in the lookup map (Lm) and a next sequential key value entry is assigned to the symbol and added to the key value segment (Sm,n), and wherein upon detecting the symbol is already stored in the lookup map (Lm), the corresponding key value assigned to this symbol is added to the next sequential entry of the key value segment (Sm,n)

wherein the generator (60) generates a new key value segment (Sm,n+i) of the lookup map (Lm) if the number of different symbols equals the number of available key values $k=2^{<n>}$ for the opened new key value segment (Sm,n) and wherein the converter (70) converts the lookup map into a segment dictionary (Dm) if the maximal key value size $knmax=2^{nmax}$ is reached, with n being any positive integral number 1 to nmax, nmax denoting the maximal bit size, and m being any positive integral number denoting the consecutive numbering of segment dictionaries (Dm).

6. The apparatus of claim 5, wherein the plurality of segment dictionaries (Dm) with the corresponding key value segments (Sm,n) are stored in the database storage (DB) as a column store database.

7. The apparatus of claim 6, wherein the converter (70) prompts the generator (60) to generate a new lookup map (Lm+i) upon converting the opened lookup map (Lm) into a segment dictionary (Dm).

8. A non-transitory computer readable storage medium storing one or more sequences of instructions for adaptively compressing an input string (10) comprising a sequence of symbols in order to create a plurality of segment dictionaries Dm, which instructions when executed by one or more processors cause performing:

generating a lookup map (110);

generating a key value segment Sm,n;

searching the lookup map for each symbol received in the input string (120, 130);

upon detecting a symbol is not stored in the lookup map, adding the symbol by storing the symbol at a next sequential key index in the lookup map (135) and assigning a next sequential key value entry to the symbol and adding this key value to the key value segment Sm,n (150);

upon detecting the symbol is stored in the lookup map, adding the corresponding key value assigned to this symbol to the next sequential entry of the key value segment Sm,n (150);

wherein a new key value segment Sm,n+i of the lookup map is generated if the number of different symbols equals the number of available key values $k=2^n$ for the opened/current key value segment Sm,n (141, 142), and wherein the lookup map is converted into a segment dictionary Dm if the maximal key value size $knmax=2^{nmax}$ is reached (132, 133, 134), with n being any positive integral number 1 to nmax, nmax denoting the maximal bit size, and m being any positive integral number denoting the consecutive numbering of segment dictionaries Dm.

9. The storage medium of claim 8, further comprising sequences of instructions which when executed cause the plurality of segment dictionaries Dm with the corresponding key value segments Sm,n to form a column store database.

10. The storage medium of claim 8, wherein the maximal key value size kn,max is predeterminable.

11. The storage medium of claim 8, wherein the maximal key value size kn,max is predeterminable.

12. The storage medium of claim 8, further comprising a digital database (DB) comprising for one column a plurality of segment dictionaries Dm, m being any positive integral number denoting the consecutive numbering of segment dictionaries Dm, each segment dictionary Dm having a number of correlated key value segments Sm,n with n being any positive integral number 1 to nmax, nmax denoting the maximal bit size of the key values, and a segment dictionary Dm having a maximum number of $knmax=2^{nmax}$ entries.

13. The storage medium of claim 12, further comprising sequences of instructions which when executed cause the segment dictionaries Dm and correlated key value segments Sm,n to form a column store database.

14. The apparatus of claim 5, wherein the converter (70) prompts the generator (60) to generate a new lookup map (Lm+i) upon converting the opened lookup map (Lm) into a segment dictionary (Dm).

* * * * *